(12) United States Patent
Zhang

(10) Patent No.: US 12,184,300 B2
(45) Date of Patent: Dec. 31, 2024

(54) DUTY-CYCLE-CORRECTING CLOCK DISTRIBUTION ARCHITECTURE

(71) Applicant: Gigajot Technology, Inc., Glendale, CA (US)

(72) Inventor: Dexue Zhang, Arcadia, CA (US)

(73) Assignee: Gigajot Technology, Inc., Pasadena, CA (US)

( * ) Notice: Subject to any disclaimer, the term of this patent is extended or adjusted under 35 U.S.C. 154(b) by 0 days.

(21) Appl. No.: 18/494,731

(22) Filed: Oct. 25, 2023

(65) Prior Publication Data
US 2024/0120934 A1 Apr. 11, 2024

Related U.S. Application Data

(63) Continuation of application No. 17/903,239, filed on Sep. 6, 2022, now Pat. No. 11,838,030, which is a continuation of application No. 17/320,078, filed on May 13, 2021, now Pat. No. 11,469,767.

(60) Provisional application No. 63/024,626, filed on May 14, 2020.

(51) Int. Cl.
*H03M 1/38* (2006.01)
*H03K 5/156* (2006.01)

(52) U.S. Cl.
CPC ............ *H03M 1/38* (2013.01); *H03K 5/1565* (2013.01)

(58) Field of Classification Search
CPC .............................. H03M 1/38; H03K 1/1565
USPC ......................................................... 341/161
See application file for complete search history.

(56) References Cited

U.S. PATENT DOCUMENTS

| | | | |
|---|---|---|---|
| 9,520,867 B2 | 12/2016 | Lin | |
| 9,716,508 B1 | 7/2017 | Zhang | |
| 10,749,534 B2 | 8/2020 | Nelson | |
| 11,469,767 B1 | 10/2022 | Zhang | |
| 11,838,030 B1 * | 12/2023 | Zhang | ................. H03K 5/1565 |
| 2011/0205100 A1 * | 8/2011 | Bogaerts | ................... G06J 1/00 |
| | | | 341/169 |
| 2012/0305752 A1 | 12/2012 | Shimizu et al. | |
| 2021/0306579 A1 | 9/2021 | Suzuki et al. | |

* cited by examiner

*Primary Examiner* — Peguy Jean Pierre
(74) *Attorney, Agent, or Firm* — Robert C. Kowert; Kowert, Hood, Munyon, Rankin & Goetzel, P.C.

(57) ABSTRACT

Clock and other cyclical signals are driven onto respective capacitively-loaded segments of a distribution path via inverting buffer stages that self-correct for stage-to-stage duty cycle error, yielding a balanced signal duty cycle over the length of the distribution path.

20 Claims, 3 Drawing Sheets

DUTY-CYCLE-CORRECTING CLOCK DISTRIBUTION ARCHITECTURE

PRIORITY APPLICATION

This application is a continuation of U.S. patent application Ser. No. 17/903,239, filed Sep. 6, 2022, which is a continuation of U.S. patent application Ser. No. 17/320,078, filed May 13, 2021, now U.S. Pat. No. 11,469,767, which claims the benefit of U.S. provisional application No. 63/024,626 filed May 14, 2020, which are incorporated by reference herein in their entirety.

TECHNICAL FIELD

The disclosure herein relates to signal duty-balanced distribution of clock and other cycling signals within image sensors and other integrated circuit devices/applications.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, clock and other cyclical signals are driven onto respective capacitively-loaded segments of a distribution path via inverting buffer stages that self-correct for stage-to-stage duty cycle error, yielding a balanced signal duty cycle over the length of the distribution path and avoiding cumulative duty cycle degradation that plagues conventional signal distribution architectures. In a number of embodiments, the duty-correcting signal distribution architecture is deployed within pixel-array readout circuitry of an integrated-circuit image sensor to distribute a high-frequency count-clock and/or digital count value to thousands or tens of thousands or more constituent counters and/or memory elements of a single-slope analog-to-digital converter (SSADC)— with those counters and/or memory elements provided to digitize respective column outputs of a megapixel or gigapixel sensor array. Duty-correcting signal distribution circuitry in accordance with embodiments presented herein may more generally be deployed within any circuit architecture that requires distribution of pulsed or cyclical signals over a capacitive distribution network that may otherwise suffer cumulative pulse-width and/or duty-cycle degradation traversing that network.

Figure 1:
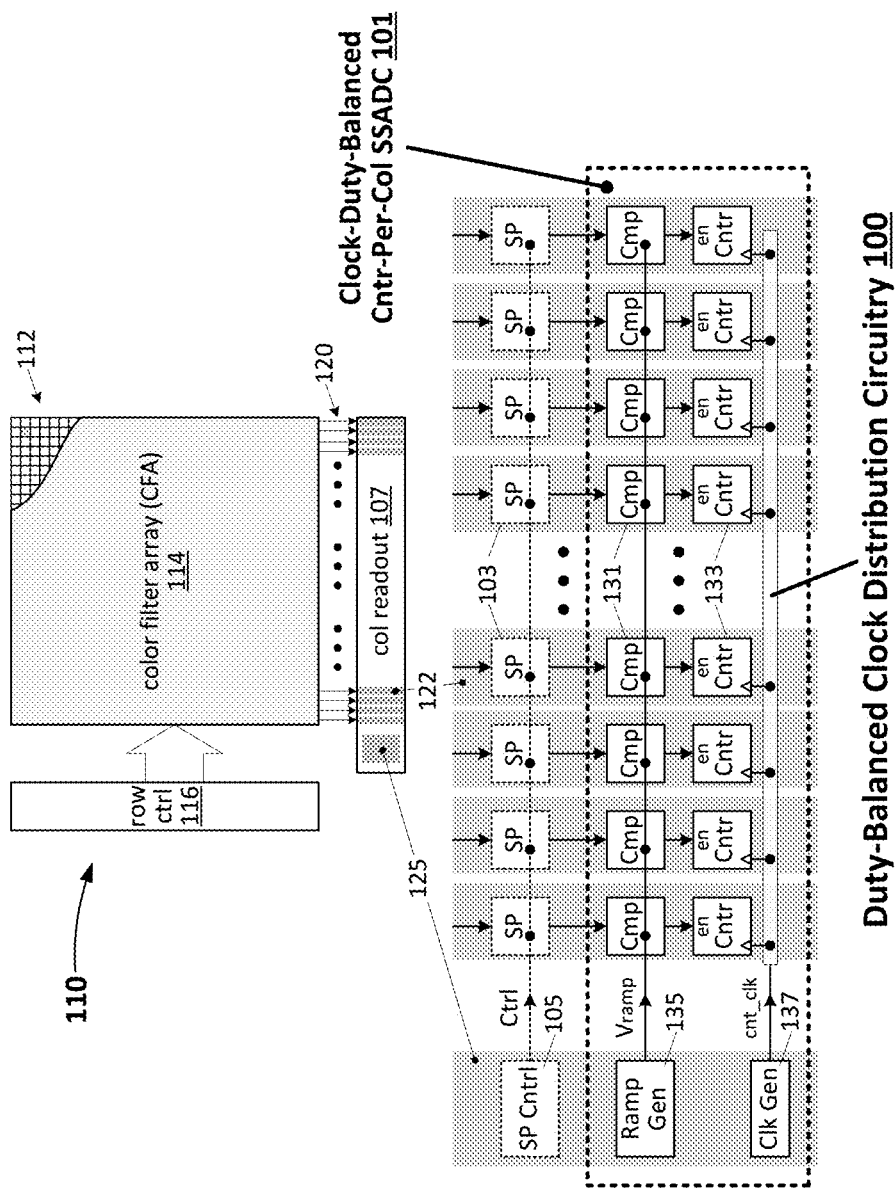
FIG. 1 illustrates an exemplary disposition of duty-balanced clock distribution circuitry within a counter-per-column single-slope analog-to-digital converter (SSADC)

FIG. 1 illustrates an exemplary disposition of duty-balanced clock distribution circuitry 100 within a counter-per-column SSADC 101, the latter deployed (together with optional per-column signal-processing circuitry 103 and signal-processing control circuitry 105) within column readout logic 107 of an image sensor 110. In the depicted example, image sensor 110 additionally includes a pixel array 112 (e.g., megapixel or gigapixel array), color filter array 114 (overlaid on the illumination surface of pixel array 112—on the backside or frontside of the image sensor die), row controller 107 and column readout circuitry 109. Constituent pixels of array 112 generally include, for example and without limitation, a photodetection element (e.g., pinned photodiode), transfer gate, floating diffusion node, amplifier transistor, read-select transistor and reset transistor interconnected to form a 4-transistor (4T) active pixel (with one or more of the latter components shared among multiple photodetector/transfer-gate instances to reduce effective per-pixel transistor count). The transfer gate, read-select transistor and reset transistor for the pixels in each sensor row are sequentially activated (in response to control signals output from row controller 116) to effect pixel signal readout in which each pixel in a read-selected row of pixels drives successive reset-state and image-stage signals (e.g., signals having respective voltage levels differentially indicative of photocharge accumulated within the photodetection element during a preceding exposure interval) onto a respective one of column-output lines 120 to be sampled and digitized within column readout circuitry 107.

In the FIG. 1 embodiment, column readout circuitry 107 is implemented (at least in part) by per-column signal processing/digitization blocks 122 (coupled to respective column output lines 120) and corresponding column control circuitry 125—the former implemented by optional signal processing circuitry 103 together with comparator (131) and counter (133) components of SSADC 101, and the latter including the aforementioned signal-processing controller 105 together with ramp-generator (135) and clock generator (137) components of SSADC 101. Each per-column signal-processing circuit 103 responds to control signals from controller 105 by optionally sampling/holding, amplifying and/or combining reset-state and image-state signals (generated on the corresponding column output line 120 during each pixel-row readout) to produce, as a preconditioned readout signal, either an analog CDS output (i.e., correlated double sample in which reset-state is subtracted from signal-state in the analog domain) or reset-state/image-state signal pair (successively generated signals). Within SSADC 101, ramp generator 135 outputs an ascending (or descending) voltage ramp, Vramp, to per-column comparators 131 (cycling the ramp once or twice per pixel-row readout depending on whether processing elements 103 deliver, per column, a single CDS signal or successive reset/image-state signal pair), while clock generator 137 outputs a count-clock ("cnt_clk"—a clock signal that cycles at each step of the voltage ramp) to per-column counters 133 via duty-balanced clock distribution circuitry 100. During each ADC cycle (i.e., ADC interval in which the voltage ramp is stepped from an initial to a final voltage level), each per column comparator 131 asserts a respective count-enable signal at the count-enable input ("en") of a corresponding counter 133—enabling per-column count-increment in response to successive rising and/or falling edges of count-clock—until Vramp steps across (i.e., rises above or falls below—referred to herein as an exceedance or cross-over) the preconditioned readout signal supplied to that comparator, deasserting the count-enable signal at that point to effectively capture a count value (ADC result) corresponding to the cross-over level of Vramp. At the conclusion of each ADC cycle, the contents of counters 133—per-column ADC results—are transferred to a buffer memory (e.g., a line memory, not specifically shown) for further on-chip processing (e.g., digital-domain subtraction of reset-state from image-state, signal scaling, image reconstruction, etc.) and/or for transfer via chip-to-chip interface to an off-die image processing engine.

Figure 2:
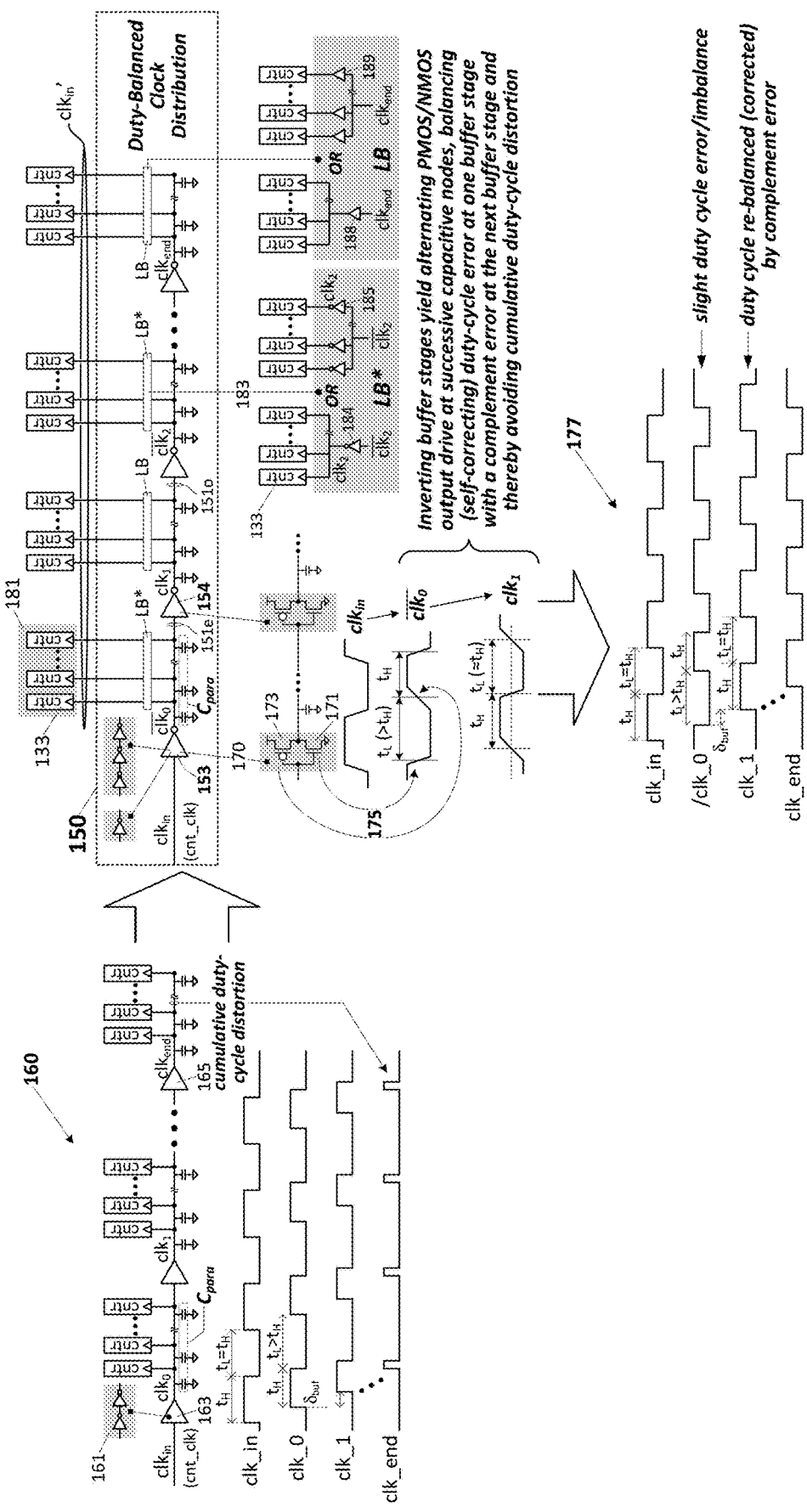
FIG. 2 illustrates a more detailed embodiment of duty-balanced clock-distribution circuitry that may be deployed within the SSADC of FIG. 1.

The number of pixels per row of array 112 and thus the number of per-column processing blocks 122 within column readout logic 107 may be immense (in the thousands or tens of thousands or more), requiring count-clock distribution to a vast number of SSADC counter elements—conveyance of a high-frequency clock signal (e.g., having a cycle time on the order of a nanosecond or less) over a lengthy conduction path (e.g., traversing the entirety or a substantial portion of the sensor IC and thus subject to significant parasitic capacitance) to drive an enormous number of capacitive loads (gates of transistors within SSADC counters 133). FIG. 2 illustrates an embodiment of duty-balanced clock-distribution circuitry 150 (e.g., that may be deployed as circuitry 100 in FIG. 1) that meets this clock distribution challenge by (i) subdividing the clock distribution path into a series of buffer driven clock-line segments 151e, 151o, (ii) driving each clock-line segment with an inverting buffer (e.g., 153) to alternate, from segment to segment, the predominant drive-transistor type for a given transition of the input clock ($clk_{in}$), and (iii) providing, for alternating clock-line segments, inverting and non-inverting local buffer elements (LB* and LB, respectively) to yield polarity-matched clock signals at all clock outputs of the distribution architecture (i.e., all SSADC counters 133 clocked by same-polarity clock signals). The segment-driving inverting buffers (153, 154, etc.) overcome a cumulative duty cycle distortion that plagues inversion-less buffer-segmented distribution schemes. In that latter (inversion-less) implementation, shown for example at 160, each clock-line segment is driven by a respective non-inverting buffer (e.g., implemented by an even number of inverter stages as shown generally at 161) so that rising edges in the input clock ($clk_{in}$—the count-clock in the SSADC context) yield corresponding rising edges at each of the buffer outputs (i.e., onto each of the clock line segments and thus at each of the dominant-capacitance nodes in the buffer chain) and vice-versa for falling $clk_{in}$ edges (all yield falling-edge at the buffer outputs). At least where inverter stages (within buffer 163) are implemented by a complementary metal oxide semiconductor (CMOS) pull-up/pull-down transistor pair (i.e., a P-type MOS or PMOS pull-up transistor and N-type MOS or NMOS pull-down transistor having gates coupled in common to form the inverter input and drains coupled in common to form the inverter output), the pull-up and pull-down transistors tend to have systemically disparate transconductance (or output-drive strength) yielding unequal rising-edge/falling-edge slew rates and thus, effectively, unequal durations of high and low buffer-output phases in response to a 50%-duty input clock. In the example at 160 in FIG. 2, for instance, NMOS transistor pull-down occurs more rapidly than PMOS transistor pull-up so that the 50% duty-cycle $clk_{in}$ (i.e., having matched high and low clock-phase durations) yields, at the output of buffer 163, a duty-cycle-distorted segment clock ($clk_0$ in the first segment)—that is, with the low-phase duration of $clk_0$ ($t_L$) being longer than, rather than equal to, the high-phase duration ($t_H$) of that clock signal. The following segment buffer (driving $clk_1$) repeats this duty-cycle distortion, in this case starting from an already distorted input clock ($clk_0$) and thus yielding an output clock ($clk_1$) that exhibits the combined duty-distortion effects of both buffer stages—that is, a cumulative duty-cycle distortion that, toward the end of the buffer chain (e.g., at the $clk_{end}$ output from the final segment buffer 165 and subject to the cumulative distortion of hundreds or thousands or more preceding buffer stages), may yield outright clock failure (e.g., runt pulses or glitches) and thus limit the practicable input clock frequency (and by extension the maximum ADC cycle frequency) and/or length of the clock distribution path.

Still referring to FIG. 2, each inverting buffer (153, 154, etc.) within exemplary duty-balanced architecture 150 is implemented by an odd number of CMOS inverter stages (e.g., one, three, five, etc.) and thus yields an inverted output relative to the inverting-buffer input. Accordingly, each successive pair of inverting buffers drive their respective clock-line segments to opposite polarities in response to a given input clock edge, so that the same input clock edge that yields an NMOS pull-down at the output of one inverting buffer stage yields a PMOS pull-up at the succeeding inverter buffer stage. Referring specifically to the inverting buffers for the first two clock-line segments (i.e., 153 and 154, driving/clk0 and clk1, respectively, onto 151e and 151o, where '/' denotes inversion or active-low) and assuming, for purposes of example, that each inverting buffer is implemented by a final-stage CMOS inverter (as shown at 170) having a systemically stronger NMOS pull-down transistor 171 than the complementary PMOS pull-up transistor 173, then the non-equal output slew rates of those transistors (i.e., pull-up slew rate of transistor 173 in response to a high-to-low transition of inverter input slower than pull-down slew rate of transistor 171 in response to a low-to-high transition of inverter input) will yield a duty-cycle distortion as shown at 175. That is, the low-phase ($t_L$) of each /clk0 cycle is longer than the high phase ($t_H$). However, because the relatively slow pull-up transition at the output of buffer 153 triggers the systemically faster pull-down transition at the output of succeeding buffer 154 (in this case rising edge of /clk0 triggering falling edge of clk1) and vice-versa, the duty cycle error imparted at each inverting buffer within architecture 150 is effectively reversed by the complement error at the succeeding buffer. Referring to the depicted $clk_{in}$, /$clk_0$, $clk_1$ examples, for instance, the incremental duty cycle distortion in /$clk_0$ is reversed by the complement distortion in the next-segment buffer (154) so that $clk_1$ is restored to the nominally ideal (50%) duty cycle of the input clock, $clk_{in}$. That is, as shown in multi-cycle timing diagram 180, the slight duty cycle error/imbalance imparted to /$clk_0$ (by inverting segment buffer 153) is self-corrected by the complement error imparted by inverting segment buffer stage 154 so that nominally ideal (50% or balanced) is restored at every other clock-line segment, avoiding the cumulative duty-cycle distortion that plagues conventional distribution architectures.

In the FIG. 2 embodiment, the inverted-polarity clock driven onto every other clock line segment (i.e., /$clk_0$, /$clk_2$, etc.) is restored to non-inverted polarity within an inverting local buffer structure, LB* (i.e., a buffer structure coupled between the clock line segment and a group or subgroup 181 of SSADC counters 133)— implemented for example as shown at 183, by a single local inverter 183 (which may be implemented by any odd number of CMOS inverter stages in series) that drives the count inputs of the counter group for the corresponding clock-line segment, or by multiple local inverters 185 coupled to count inputs of respective counters within the counter group (or any implementation between those two extremes, with a respective inverter for every N counters within a given counter group). To equalize nominal propagation delays from a clock line segment to the corresponding counter group, a non-inverting local buffer structure (LB) may be coupled between clock line segments driven by non-inverted clocks (e.g., $clk_1$, $clk_3$, $clk_5$, . . . , clk$_{end}$, in the example shown), with each of those local buffers implemented generally as its inverting counterpart (e.g., single buffer 188 or multiple buffers 189), but with even numbers of constituent inverter stages instead of odd (e.g., with LB transistors sized differently than LB* transistors to yield nominally equal propagation delays). In all segment buffers and local buffers (inverting or not) implemented by multiple CMOS inverter stages, individual inverter stages may be sized progressively larger from buffer input to buffer output (e.g., or otherwise have relatively higher transconductance as necessary to yield drive strength sufficient for the subject capacitive load), with ratioed sizing achieved through ratioed transistor dimensioning and/or transistor-ganging (parallel coupling of two or more transistors).

Figure 3:
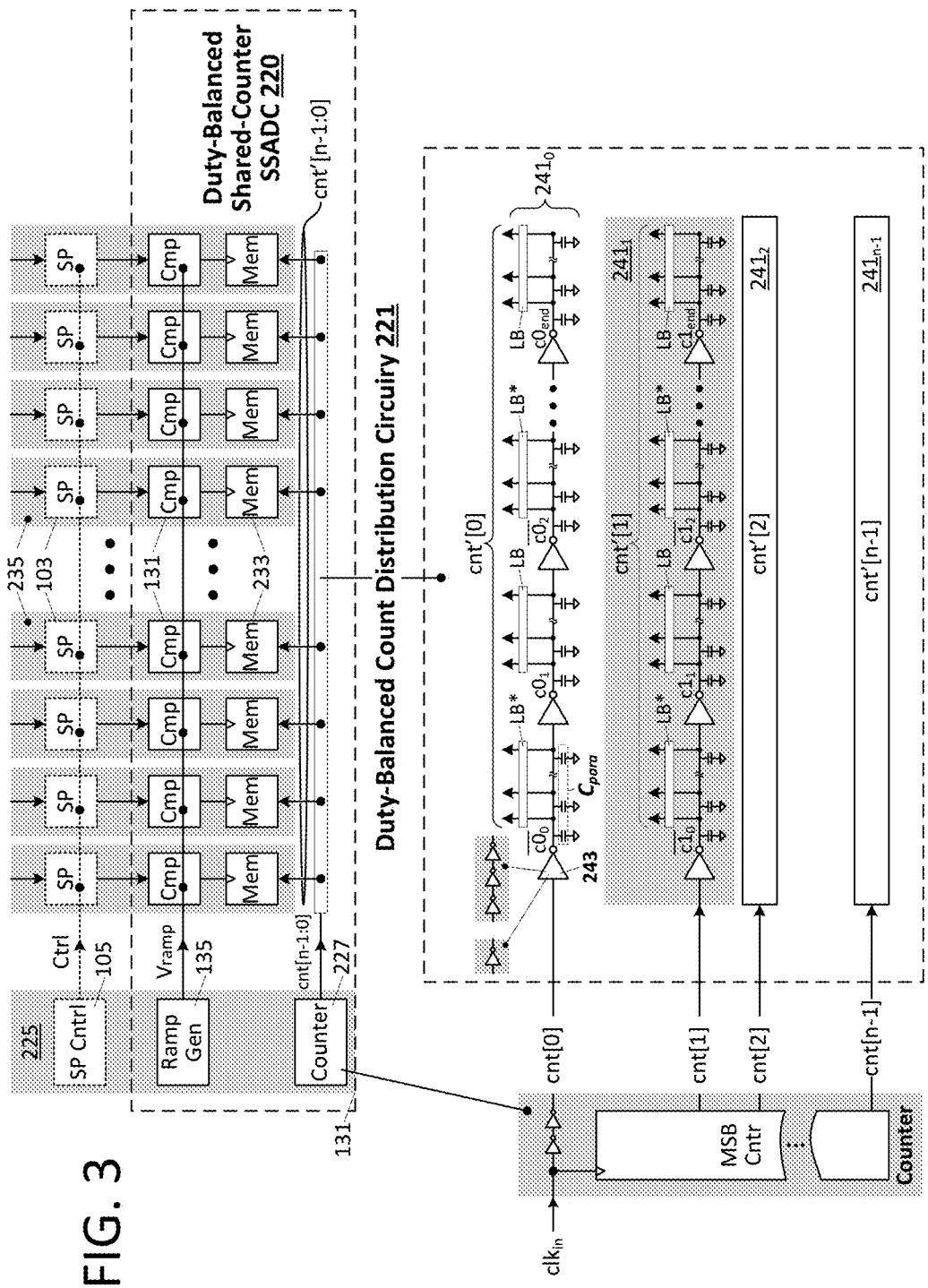
FIG. 3 illustrates an alternative SSADC embodiment having circuitry to distribute a duty-balanced count value instead of or in addition to a duty-balanced clock signal.

FIG. 3 illustrates an alternative SSADC embodiment 220 (e.g., to be deployed within column readout logic of an image sensor IC) having circuitry 221 to distribute a duty-balanced count value instead of or in addition to a duty-balanced clock signal. In the depicted example, column control circuitry 225 includes the optional signal-processing controller 105 (to control SP elements 103) and ramp generator 135 discussed above together with a column-shared counter (global) 227 that delivers a count value to respective memory elements 233 (e.g., registers, latches, etc.) disposed within per-column signal processing/digitization blocks 235. Each of the memory elements 233 responds to a comparator-signal transition (i.e., signal from respective comparator 131 that transitions from high to low or vice-versa in response to a Vramp step that crosses (rises above or below) the preconditioned readout signal supplied to that comparator) by capturing (latching, registering, storing, etc.), as an ADC result, the current count output of column-shared counter 227. In one embodiment, column-shared counter 227 increments an n-bit count value at each edge (rising and falling) of an input clock (e.g., clk$_{in}$ received from a clock signal generator as shown in FIG. 1), outputting a buffered instance of the count-clock itself as the least significant bit of the count value (e.g., cnt[0]=0 during low-phase of clk$_{in}$, cnt[0]=1 during high phase of clk$_{in}$), distributing that cyclical signal to per-column memory elements via a duty-balanced signal distribution circuit 241$_0$ implemented generally as discussed above in reference to FIG. 2. That is, inverting buffers 243 drive respective signal line segments (with alternating inverting/non-inverting local buffers (LB*, LB) provided to deliver same-polarity instances of cnt[0] to inputs of respective memory elements 233), thereby avoiding cumulative duty-cycle distortion along the signal distribution chain. In the FIG. 3 embodiment, each of the other count bits—i.e., cnt[1] through cnt[n−1], each cycling/toggling at an exponentially subdivided frequency according to bit significance (i.e., toggle frequency of cnt[i]=frequency of clk$_{in}$/2$^i$)— is distributed through a respective duty-balanced signal distribution circuit (i.e., 241$_1$, 241$_2$, . . . , 241$_{n-1}$) that nominally matches signal propagation delays incurred in the highest toggle-frequency count bit (i.e., cnt[0]), thus aligning arrival of constituent count-value bits at memory inputs of memory elements 233 (i.e., limiting/avoiding bit-to-bit skew). In alternative embodiments, the count value supplied to memory elements 233 is gray-coded (or otherwise encoded within counter 227 relative to a binary count) to avoid simultaneous transition of multiple (e.g., two or more) constituent count-value bits. In these embodiments, constituent bits of the count-value generally toggle at a frequency lower than the input clock (which is not supplied as a count bit), but may still suffer cumulative duty cycle distortion along a conventional distribution path—a duty cycle distortion that is self-corrected in the FIG. 3 signal distribution circuits 241$_0$-241$_{n-1}$. In alternative embodiments, signal distribution circuits for lower frequency bits may vary from those for higher frequency bits to reduce signal-distribution foot-print/power (e.g., fewer inverter stages per segment buffer, including an even number of buffer stages where non-inverting drive will not detrimentally affect count-bit duty cycle as a percentage of the total cycle time for that count bit). As in embodiments above, the inverting and non-inverting local buffers may be implemented in various ways (e.g., single local buffer coupled between signal-line segment and group of memory elements, local buffer per memory element, or local buffer per each of multiple subsets of memory elements within a memory-element group). Also, while not specifically shown, ADC results latched within memory elements 233 may be transferred to a line buffer or other holding memory at completion of each SSADC cycle (each Vramp start to finish) to enable ADC execution for a subsequent row of pixels while ADC results for the preceding pixel row are delivered to on-chip or off-chip downstream circuitry— that is, to enable concurrency or pipelining of ADC and data-transfer operations. In alternative embodiments, the outputs of duty-balanced count distribution circuitry 221 (i.e., cnt' [n−1:0]) may be demultiplexed to either of two sets of memory elements 233, alternating between the demultiplexed selection to implement a pipeline-enabling double-buffering arrangement (i.e., effectively alternating roles of the two sets of memory elements from one SSADC cycle to the next, with one memory-element set serving as the SSADC count-latch and the other serving as the output buffer/line buffer during each SSADC cycle).

The various signal distribution architectures, image sensor architectures, color filter arrays, micro-lens arrays, circuit operating methodology, etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific time intervals, transistor types, signal polarities, transistor types or technologies, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational/configurable parameters may be achieved, for example and without limitation, by loading a control value into a register or other storage circuit within above-described integrated circuit devices in response to a host instruction and/or on-board processor or controller (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit image sensor comprising:
   a pixel array that includes a plurality of pixel elements, wherein outputs of the pixel elements are controlled by a clock signal; and
   a clock distribution circuitry that distributes the clock signal to respective count-value elements configured to receive the clock signal along a signal distribution path, wherein the clock distribution circuitry is configured to:
   alternately generate inverted and non-inverted instances of the clock signal on successive segments of the signal distribution path;
   route the inverted instances of the clock signal to first count-value elements via circuitry that complements the inverted instances of the clock signal; and
   route the non-inverted instances of the clock signal to second count-value elements without complementing the non-inverted instances,
   wherein the alternate generation of the inverted and non-inverted instances of the clock signal avoids propagation of a cumulative distortion of the clock signal along the signal distribution path.

2. The integrated-circuit image sensor of claim 1, wherein the clock signal has a cycle time of a nanosecond or less.

3. The integrated-circuit image sensor of claim 1, wherein the clock distribution circuitry is implemented as part of a readout circuitry of the pixel array.

4. The integrated-circuit image sensor of claim 3, wherein the clock signal is generated by a clock generator implemented as part of a signal process controller of the readout circuitry.

5. The integrated-circuit image sensor of claim 1, wherein the clock signal is a 50% duty-cycle clock signal.

6. The integrated-circuit image sensor of claim 1, wherein the clock distribution circuitry includes a pull-up transistor that generates a rising edge in the clock signal and a pull-down transistor that generates a falling edge of the clock signal, wherein the pull-up and pull-down transistors have unequal slew rates to cause a duty-cycle distortion in the clock signal.

7. The integrated-circuit image sensor of claim 6, wherein the clock distribution circuitry causes a first duty-cycle distortion of the clock signal added at a first buffer stage of the signal distribution path to be reversed by a complement duty-cycle distortion of the clock signal added by a next buffer stage of the signal distribution path after the first buffer stage.

8. The integrated-circuit image sensor of claim 1, wherein pixel array is a megapixel sensor array.

9. The integrated-circuit image sensor of claim 1, wherein pixel array is a gigapixel sensor array.

10. The integrated-circuit image sensor of claim 1, wherein multiple ones of the first count-value elements are grouped into a counter group that is inverted by a single local inverter associated with the counter group.

11. A method comprising:
    performing, by an integrated-circuit image sensor:
    generating a clock signal used to control outputs of a plurality of pixel elements in a pixel array;
    distributing, via a clock distribution circuitry, the clock signal to respective count-value elements along a signal distribution path, wherein the distributing includes:
    alternately generating inverted and non-inverted instances of the clock signal on successive segments of the signal distribution path;
    routing the inverted instances of the clock signal to first count-value elements via circuitry that complements the inverted instances of the clock signal; and
    routing the non-inverted instances of the clock signal to second count-value elements without complementing the non-inverted instances,
    wherein the alternately generating of the inverted and non-inverted instances of the clock signal avoids propagation of a cumulative distortion of the clock signal along the signal distribution path.

12. The method of claim 11, wherein the clock signal has a cycle time of a nanosecond or less.

13. The method of claim 11, wherein the clock distribution circuitry is implemented as part of a readout circuitry of the pixel array.

14. The method of claim 13, wherein the clock signal is generated by a clock generator, and the clock generator is implemented as part of a signal process controller of the readout circuitry.

15. The integrated-circuit image sensor of claim 11, wherein the clock signal is a 50% duty-cycle clock signal.

16. The method of claim 11, further comprising:
    causing a pull-up transistor to generate a rising edge in the clock signal;
    causing a pull-down transistor to generate a falling edge of the clock signal,
    wherein the pull-up and pull-down transistors have unequal slew rates to cause a duty-cycle distortion in the clock signal.

17. The method of claim 16, further comprising:
    causing a first duty-cycle distortion of the clock signal at a first buffer stage of the signal distribution path;
    causing a complement duty-cycle distortion of the clock signal at a next buffer stage of the signal distribution path after the first buffer stage, wherein the complement duty-cycle distortion reverses the first duty-cycle distortion.

18. The method of claim 11, wherein pixel array is a megapixel sensor array.

19. The method of claim 11, wherein pixel array is a gigapixel sensor array.

20. The method of claim 11, wherein multiple ones of the first count-value elements are grouped into a counter group, and the complementing of the inverted instances of the clock signal received by the multiple count-value elements is performed by a single local inverter associated with the counter group.

\* \* \* \* \*